(12) United States Patent
Shinriki et al.

(10) Patent No.: US 6,866,882 B1
(45) Date of Patent: Mar. 15, 2005

(54) METHOD OF FORMING A THIN FILM

(75) Inventors: Hiroshi Shinriki, Chiba (JP); Kenji Matsumoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/657,627

(22) Filed: Sep. 8, 2000

Related U.S. Application Data (63) Continuation of application No. PCT/JP00/01233, filed on Mar. 2, 2000.

(30) Foreign Application Priority Data

Mar. 12, 1999 (JP) .......................................... 11-066552

(51) Int. Cl.$^7$ ................................................. B05D 5/12
(52) U.S. Cl. ............................. 427/126.3; 427/255.31; 427/255.35; 427/255.36; 427/255.7
(58) Field of Search ....................... 427/255.29, 255.31, 427/255.32, 255.35, 255.36, 126.3, 255.7

(56) References Cited

U.S. PATENT DOCUMENTS

| | | | |
|---|---|---|---|
| 4,514,441 A | | 4/1985 | Alexander |
| 4,951,603 A | | 8/1990 | Yoshino et al. |
| 5,155,658 A | * | 10/1992 | Inam et al. ................. 361/321 |
| 5,478,610 A | | 12/1995 | Desu et al. |
| 5,500,988 A | * | 3/1996 | Moynihan et al. .......... 427/100 |
| 5,536,323 A | | 7/1996 | Kirlin et al. |
| 5,555,154 A | | 9/1996 | Uchikawa et al. |
| 5,595,606 A | | 1/1997 | Fujikawa et al. |
| 5,624,498 A | | 4/1997 | Lee et al. |
| 5,641,540 A | | 6/1997 | Lee et al. |
| 5,653,806 A | | 8/1997 | Van Buskirk |
| 5,766,364 A | | 6/1998 | Ishida et al. |
| 5,817,170 A | * | 10/1998 | Desu et al. .............. 427/126.3 |
| 5,876,503 A | * | 3/1999 | Roeder et al. ......... 427/255.23 |
| 6,051,286 A | * | 4/2000 | Zhao et al. ............ 427/255.39 |
| 6,066,204 A | | 5/2000 | Haven |
| 6,074,487 A | | 6/2000 | Yoshioka et al. |
| 6,077,715 A | | 6/2000 | Chivukula et al. |
| 6,086,677 A | | 7/2000 | Umotoy et al. |
| 6,090,210 A | | 7/2000 | Ballance et al. |
| 6,106,625 A | | 8/2000 | Koai et al. |
| 6,126,753 A | | 10/2000 | Shinriki et al. |
| 6,161,500 A | | 12/2000 | Kopacz et al. |
| 6,176,929 B1 | | 1/2001 | Fukunaga et al. |
| 6,179,920 B1 | | 1/2001 | Tarutani et al. |
| 6,190,728 B1 | * | 2/2001 | Suzuki et al. ............ 427/126.3 |
| 6,204,204 B1 | | 3/2001 | Paranjpe et al. |
| 6,225,237 B1 | | 5/2001 | Vaartstra |

(List continued on next page.)

FOREIGN PATENT DOCUMENTS

| | | |
|---|---|---|
| JP | 2847981 | 11/1968 |
| JP | 06-275546 | 9/1994 |
| JP | 6275548 | 9/1994 |
| JP | 7-150359 | 6/1995 |
| JP | 1998-60530 | 10/1998 |
| JP | 2000-58525 | 2/2000 |
| KR | 920010426 B1 | 11/1992 |
| KR | 1998-60528 | 10/1998 |

*Primary Examiner*—Bret Chen
(74) *Attorney, Agent, or Firm*—Finnegan, Henderson, Farabow, Garrett & Dunner, LLP

(57) ABSTRACT

The vacuum degree in a reactor is set to as low as 0.1 Torr. In this state, a butyl acetate solution in which Pb(DPM)$_2$ is dissolved at a concentration of 0.1 mol is transported from a Pb source generator to an evaporator, while the flow rate of the butyl acetate solution is controlled to a predetermined flow rate by a massflow controller, to evaporate the Pb(DPM)$_2$ dissolved together with the butyl acetate by the evaporator. Helium gas is added to these at a flow rate of 250 sccm, and the mixed gas is transported to a shower head. With this operation, source gases are supplied to a wafer in the reactor, while the partial pressure of each source gas is set low.

10 Claims, 9 Drawing Sheets

U.S. PATENT DOCUMENTS

| | | |
|---|---|---|
| 6,258,157 B1 | 7/2001 | Gordon |
| 6,281,022 B1 | 8/2001 | Li et al. |
| 6,309,465 B1 * | 10/2001 | Jurgensen et al. .......... 118/715 |
| 6,312,816 B1 | 11/2001 | Roeder et al. |
| 6,325,017 B1 | 12/2001 | DeBoer et al. |
| 6,419,994 B1 | 7/2002 | Marsh |
| 6,428,850 B1 | 8/2002 | Shinriki et al. |
| 6,470,144 B1 | 10/2002 | Tarutani et al. |
| 2002/0166507 A1 | 11/2002 | Shinriki et al. |
| 2003/0000473 A1 | 1/2003 | Chae et al. |
| 2003/0170388 A1 | 9/2003 | Shinriki et al. |

* cited by examiner

METHOD OF FORMING A THIN FILM

This application is a continuation of a PCT/JP00/01233 filed Mar. 2, 2000.

BACKGROUND OF THE INVENTION

The present invention relates to a thin film forming method and thin film forming apparatus for forming a PZT thin film serving as a ferroelectric film containing lead (Pb), zirconium (Zr), titanium (Ti), and oxygen (O).

Ferroelectric memory elements have received a great deal of attention as a next-generation nonvolatile memory, and extensive studies have been made on them. This ferroelectric memory element is formed as a memory cell using a ferroelectric capacitor formed by sandwiching a ferroelectric film between two electrodes. A ferroelectric has "self-polarization" characteristics, i.e., characteristics in which polarization remains even at a zero voltage once a voltage is applied to the ferroelectric. A ferroelectric memory element is a nonvolatile memory using this.

A $Pb(Zr,Ti)O_3$(PZT) film is widely used as the ferroelectric film of such a ferroelectric memory element.

Figure 9:
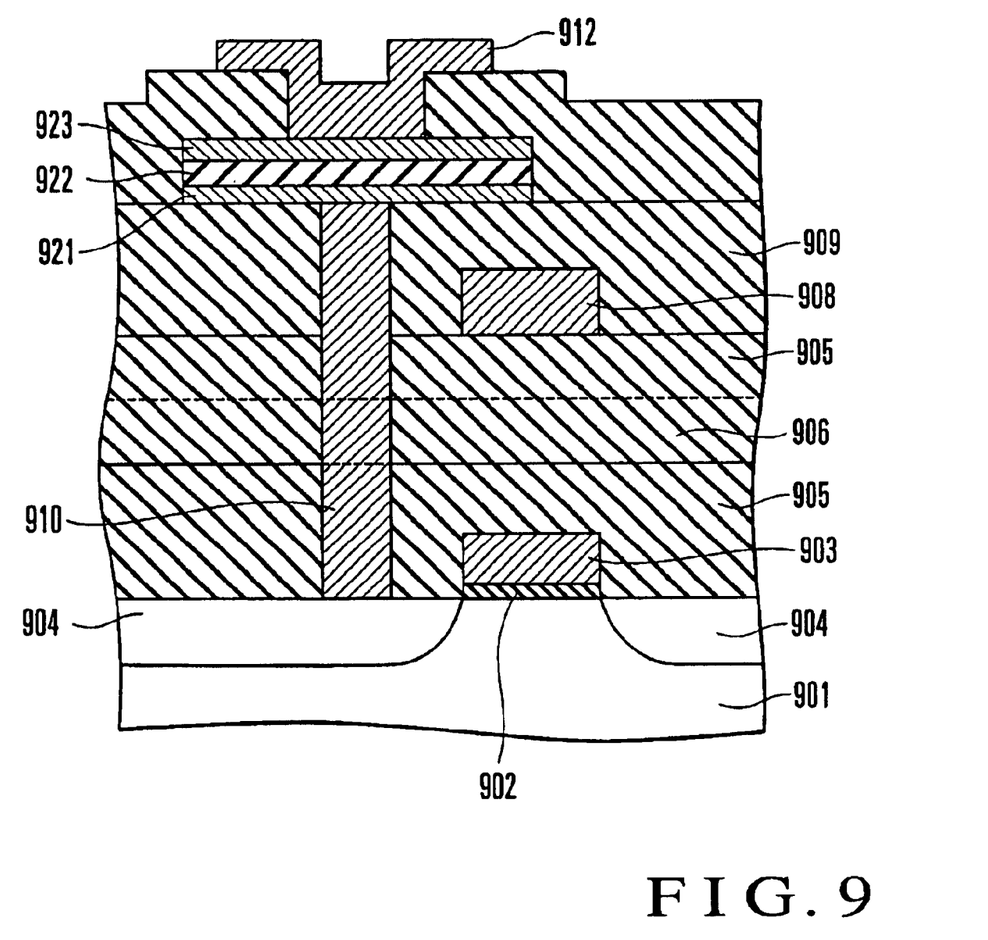
FIG. 9 is a sectional view showing the arrangement of a ferroelectric memory element.

The arrangement of a ferroelectric memory element using a PZT thin film will be described below. In this memory element, as shown in FIG. 9, basically, a stacked capacitor using a ferroelectric film is connected to a MOS transistor formed on a silicon substrate 901. The MOS transistor is made up of a gate electrode 903 formed on the semiconductor substrate 901 through a gate insulating film 902 and a source and drain 904 formed from diffusion layers formed on two sides of the gate electrode 903. The capacitor is made up of a Pt/TiN lower electrode 921, a PZT ferroelectric film 922 formed on the lower electrode 921, and an $Ir/IrO_2$ upper electrode 923 formed on the ferroelectric film 922.

An interlevel insulating film 905 is formed to cover the gate electrode 903. An interconnection layer 906 serving as a bit line, which does not appear in the section of FIG. 9, is formed on the interlevel insulating film 905. An interlevel insulating film 907 is formed on the interconnection layer 906. The interconnection layer 906 is connected to one of the source and drain 904. An interconnection layer 908 is formed on the interlevel insulating film 907. The capacitor is formed on an interlevel insulating film 909 formed to cover the interconnection layer 908. The lower electrode 921 constructing the capacitor is connected to the other of the source and drain 904 through a tungsten (W) plug 910 formed in a through hole formed to extend through the interlevel insulating films 905, 907, and 909.

An insulating film 911 is formed to cover the capacitor. An interconnection layer 912 connected to the upper electrode 923 is formed on the insulating film 911.

As described above, when a ferroelectric film of PZT or the like is used, the ferroelectric film is located on an upper layer in the integrated circuit due to the following reason.

PZT is an oxide and readily reduced in an reducing atmosphere, degrading the ferroelectric characteristics. The ferroelectric characteristics readily degrade in a highly reactive environment of dry etching or the like.

A portion formed in the initial stage in the general manufacturing process of semiconductor devices tends to be exposed in a reducing atmosphere of hydrogen annealing or the like in the subsequent process. Many dry processes using plasmas, such as interconnection patterning, must be performed.

In the structure of a conventional DRAM or the like in which a capacitor is arranged immediately above a transistor, a capacitor is formed in the initial stage of the manufacture of the semiconductor device, and an interconnection structure is formed on the capacitor. A PZT film constructing a capacitor must undergo many processes in an atmosphere where the above-mentioned characteristics readily degrade.

In a ferroelectric memory element having a capacitor formed from a PZT thin film, the capacitor is located above, e.g., a multilevel interconnection structure of a semiconductor device. The capacitor is formed in the final stage in the manufacture of the semiconductor device.

As described above, since the capacitor is formed above the interconnection structure, the PZT thin film which forms the capacitor is formed at a temperature of 450° C. or less due to the following reason. The interconnection structure located below the capacitor is generally made of a metal material such as aluminum, and the metal material cannot stand at high temperatures exceeding 450° C.

There is proposed a technique of forming a PZT film at a temperature of 420° C. or less in consideration of the heat-resistant temperature of the underlying aluminum interconnection. This PZT thin film forming method will be described below. Organic metal source gases of Pb and Ti and an oxidizing gas such as $N_2O$, $O_2$, or $NO_2$ are supplied at a pressure as low as 5 mTorr to a substrate heated to 445° C. A $PbTiO_3$ crystal nucleus is formed by chemical vapor deposition (CVD) using organic metal (MO) materials. While keeping the pressure as low as 5 mTorr, organic metal source gases of Pb, Zr, and Ti and an oxidizing gas such as $N_2O$ are supplied to the substrate kept at 445° C. Since the $PbTiO_3$ crystal nucleus is already present on the substrate, a PZT crystal grows even at the temperature as low as 445° C. to form a PZT thin film of perovskite crystal on the substrate.

According to the conventional method, a PZT thin film cannot be formed with a uniform composition on the entire substrate. The nonuniform composition results in variations in ferroelectric characteristics in the resultant PZT thin film. The variations in composition of the resultant thin film may be caused by the molecular flow of the MO source gases supplied to the substrate. Conventionally, the MO source gases are supplied at a pressure as low as several mTorr (high vacuum state) as described above. In the high vacuum state, the flow of each MO source gas becomes a molecular flow state. It is very difficult to uniformly supply each MO source gas to the substrate in this molecular flow state.

SUMMARY OF THE INVENTION

It is, therefore, a principal object of the present invention to provide a thin film forming method and thin film forming apparatus in which a composition is uniform.

In order to achieve the above object, according to the present invention, there is provided a thin film forming method comprising the first step of forming a crystal nucleus of perovskite structure of an oxide made up of lead and titanium on a substrate, and the second step of setting the substrate having the crystal nucleus at a predetermined temperature, supplying an oxide gas and organic metal source gases of lead, zirconium, and titanium diluted with a diluent gas to the substrate, and forming on the substrate a ferroelectric film of perovskite crystal structure of an oxide made up of lead, zirconium, and titanium at a pressure of not less than 0.1 Torr.

According to the present invention, the second step comprises supplying the organic metal source gases in a viscous flow state changed from an intermediate flow state due to the pressure of not less than 0.1 Torr.

According to the present invention, there is provided a thin film forming apparatus comprising a sealable reactor in which a substrate as a film formation target is placed, evacuating means for evacuating the interior of the reactor to a predetermined pressure, first source gas generation means for generating a lead source gas made up of an organic metal compound containing lead and a titanium source gas made up of an organic metal compound containing titanium, second source gas generation means for generating a lead source gas, titanium source gas, and zirconium source gas made up of an organic metal compound containing zirconium, oxidizing gas generation means for generating an oxidizing gas, dilution means for diluting the gas generated by the second source gas generation means with a diluent gas, source gas supply means for supplying to the substrate in the reactor the gas generated by the first source gas generation means and the gas diluted by the dilution means, and oxidizing gas supply means for supplying to the substrate in the reactor the oxidizing gas generated by the oxidizing generation means.

According to the present invention, since the film forming apparatus comprises the dilution means, the partial pressure of each source gas supplied from the second source gas generation means through the source gas supply means to the reactor becomes low. For this reason, the reaction between the source gases and the oxidizing gas in a gaseous phase in the reactor is suppressed from progressing before the source gases and the oxidizing gas reach the substrate, and the oxidation reaction progresses on the substrate, thus forming on the substrate a PZT thin film having a good crystalline state.

DESCRIPTION OF THE PREFERRED EMBODIMENTS

Embodiments of the present invention will be described below with reference to the accompanying drawings.

First Embodiment

Figure 1:
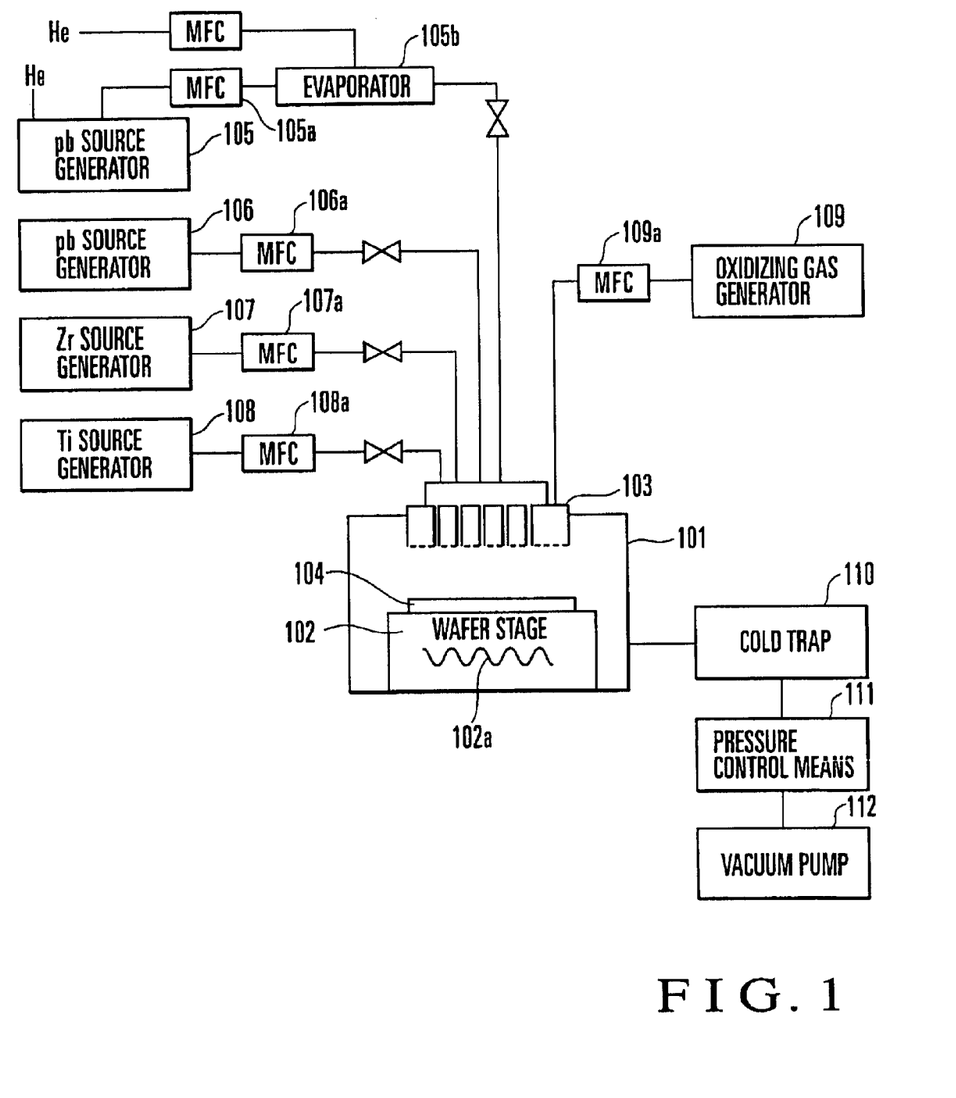
FIG. 1 is a diagram showing the arrangement of a film forming apparatus used in the first embodiment of the present invention.

First of all, the first embodiment of the present invention will be described. In the first embodiment, a PZT thin film is formed by using, e.g., a film forming apparatus as shown in FIG. 1. The film forming apparatus includes a wafer stage 102 and a shower head 103 arranged opposite to the wafer stage 102 in a reactor 101. The wafer stage 102 incorporates a heater 102a, and the heater 102a heats a wafer 104 placed on the wafer stage 102. The wafer 104 is comprised of, e.g., a silicon substrate, and an integrated circuit made up of a plurality of transistors, interconnection layers, and the like is already formed on the surface of the wafer 104. Some of the above transistors constitute memory cells, and a lower electrode, made of platinum or the like, of a capacitor to be connected to each corresponding transistor is already formed. A case wherein a PZT thin film serving as a capacitor insulating film is formed on the lower electrode will be described as an example in the following description including other embodiments. Therefore, supplying gas to a wafer means supplying gas to the lower electrode, made of platinum or the like, formed on the wafer.

Generated MO source gases are supplied from two Pb source generators 105 and 106, a Zr source generator 107, and a Ti source generator 108 to the reactor 101, in which the wafer 104 is placed. An oxidizing gas such as $N_2O$ or $O_2$ is supplied from an oxidizing gas generator 109.

First, a butyl acetate solution in which $Pb(DPM)_2$ is dissolved at a concentration of 0.1 mol is prepared in the Pb source generator 105. The butyl acetate solution supplied from the Pb source generator 105, in which the Pb source is dissolved, is transported to an evaporator 105b, while the flow rate of the butyl acetate solution is controlled by a flow rate control means (MFC) 105a. DPM stands for "dipivaloylmethanate $C_{11}H_{19}O_2$". Evaporation of the butyl acetate solution by the evaporator 105b allows the resultant butyl acetate gas and $Pb(DPM)_2$ gas to be supplied through the shower head 103 to the reactor 101. Note that the resultant gases together with a carrier gas such as helium is transported from the evaporator 105b to the shower head 103. The carrier gas is a diluent gas for decreasing the concentration of a source gas, and the evaporator 105b generates a source gas and at the same time, functions as a dilution means for diluting the source gas with a diluent gas.

Also, in the Pb source generator 106, $Pb(DPM)_2$ is prepared. The $Pb(DPM)_2$ sublimates by heating to a temperature of about 170° C. to generate a Pb source gas. In the Zr source generator 107, $Zr(O-t-Bu)_4$ is prepared. The $Zr(O-t-Bu)_4$ sublimates by heating to a temperature of about 80° C. to generate a Zr source gas. The Zr source gas is supplied through the shower head 103 to the reactor 101, while the flow rate of the source gas is controlled by a flow rate control means 107a. Similarly, in the Ti source generator 108, $Ti(O-i-Pr)_4$ is prepared. The $Ti(O-i-Pr)_4$ sublimates by heating to a temperature of about 75° C. to generate a Ti source gas. The Ti source gas is supplied through the shower head 103 to the reactor 101, while the flow rate of the source gas is controlled by a flow rate control means 108a.

Note that an oxidizing gas to be transported from the oxidizing gas generator 109 is supplied through the shower head 103 to the reactor 101, while the flow rate of the oxidizing gas is controlled by a flow rate control means 109a. In the first embodiment, the Pb source generator 106 and Ti source generator 108 constitute the first source gas generation means, and the Pb source generator 105, Zr source generator 107, and Ti source generator 108 constitute the second source gas generation means.

The above source gases are mixed with each other in the shower head 103 and then supplied to the reactor 101. A plurality of discharge nozzles are arranged on the reactor 101 side of the shower head 103. The source gas mixture is uniformly supplied through the plurality of discharge nozzles to the wafer 104 placed on the wafer stage 102. The source gas system of the shower head 103 constitutes a source gas supply means. On the other hand, the oxidizing gas transported to the shower head 103 is discharged through another path, i.e., a plurality of dedicated discharge nozzles provided on the reactor 101 side of the shower head 103 without being mixed with the source gases in the shower head 103. The oxidizing gas system of the shower head 103 constitutes an oxidizing gas supply means. The discharged oxidizing gas is mixed with the source gases on the wafer 104 placed on the wafer stage 102. This prevents the source gases and the oxidizing gas from being mixed with each other in the shower head 103. Accordingly, since generation of a reaction product as a result of a reaction between the source gases and the oxidizing gas in the shower head 103 can be prevented, each source gas can stably be supplied to the wafer 104.

The reactor 101 communicates with a vacuum pump 112 through a cold trap 110 and pressure control means 111, and these constitute an evacuating means. The reactor 101 is so arranged as to obtain a reduced-pressure state by the vacuum pump 112 under the control of the pressure control means 111. The reduced-pressure state is controlled to fall within the range of, e.g., about 0.001 to 10 Torr. Note that the cold trap 110 removes a substance discharged from the reactor 101, which liquefies or solidifies at a low temperature.

In the first embodiment, by using the apparatus described above, a PZT thin film is formed on the wafer 104 in the following manner.

First of all, a crystal nucleus of $PbTiO_3$ is formed on the wafer 104.

First, the wafer 104 is placed on the wafer stage 102, and the heater 102a heats the wafer 104 to a temperature within the range of 400 to 450° C. The vacuum degree (pressure) in the reactor 101 is set at 0.001 to 0.01 Torr by, e.g., evacuation using the vacuum pump 112.

Next, $N_2O$ as an oxidizing gas is supplied to the wafer 104, and subsequently, gas (Pb source gas) obtained by sublimating $Pb(DPM)_2$ is transported at a flow rate of 0.4 sccm from the Pb source generator 106 to the shower head 103. The gas is then supplied from the shower head 103 to the wafer 104, and PbO is drawn by suction onto the surface of the wafer 104. After that, while supplying $N_2O$ and the Pb source gas, gas (Ti source gas) obtained by sublimating $Ti(O-i-Pr)_4$ is transported at a flow rate of 0.3 sccm from the Ti source generator 108 to the shower head 103. The Ti source gas is mixed with the Pb source gas in the shower head 103 and supplied to the wafer 104. $N_2O$ as the oxidizing gas is transported at a flow rate of 6 sccm to the shower head 103. As described above, the Ti source gas transported to the shower head 103 is mixed with the Pb source gas in the shower head 103 and supplied to the wafer 104 in the reactor 101. On the other hand, $N_2O$ is supplied to the wafer 104 in the reactor 101 without being mixed with the source gases in the shower head 103.

As a result, in the first embodiment, while keeping the pressure in the reactor 101 to about 0.01 to 0.001 Torr, i.e., in a high vacuum state, a crystal nucleus of $PbTiO_3$ is formed on the heated wafer 104. The formation of crystal nuclei is performed for about 50 sec.

Subsequent to this nucleus formation, a PZT thin film is formed in the following manner.

First, the heating temperature of the wafer 104 is held at the same temperature as in the previous step. The vacuum degree in the reactor 101 is set to as low as 0.1 Torr. In this state, generation of the Pb source gas is switched from the Pb source generator 106 to the Pb source generator 105. More specifically, a butyl acetate solution in which $Pb(DPM)_2$ is dissolved at a concentration of 0.1 mol is transported from the Pb source generator 105 to the evaporator 105b, while the flow rate of the butyl acetate solution is controlled to a predetermined flow rate by the flow rate control means 105a, to evaporate by the evaporator 105b the $Pb(DPM)_2$ dissolved together with the butyl acetate. Helium gas is added to these at a flow rate of 250 sccm, and the mixed gas is transported to the shower head 103. At this time, the transport flow rate of the Pb source gas, i.e., the evaporated $Pb(DPM)_2$ transported from the evaporator 105b is set at about 0.4 sccm in a normal state. Note that the transport flow rate of the evaporated butyl acetate is about 27 sccm.

Also, the Ti source gas is transported at a flow rate of 0.35 sccm to the shower head 103.

In addition, fresh Zr source gas is supplied to the wafer 104. The Zr source gas, i.e., a gas obtained by sublimating $Zr(O-t-Bu)_4$ is transported at a flow rate of 0.3 sccm to the shower head 103. As a result, in the shower head 103, butyl acetate, helium, and the Zr source gas are added to the Pb source gas and Ti source gas and mixed with each other. The Pb source gas, Ti source gas, Zr source gas, butyl acetate, and helium mixed in advance are supplied to the wafer 104. $N_2O$ is also supplied to the wafer 104 separately from the source gases.

At this time, on the wafer 104 in the reactor 101, the partial pressure of $Pb(DPM)_2$ as the Pb source gas is 0.1 Torr×{0.4/(0.4+27+250+0.3+0.35+6)}≈0.000141 Torr. Also, the partial pressure of $Ti(O-i-Pr)_4$ as the Ti source gas is 0.1 Torr×{0.3/(0.4+27+250+0.3+0.35+6)}≈0.000105 Torr, and that of $Zr(O-t-Bu)_4$ as the Zr source gas is 0.1 Torr×{0.35/(0.4+27+250+0.3+0.35+6)}≈0.000123 Torr.

As described above, in the first embodiment, the pressure in the reactor 101 after nucleus formation is as low as about 0.1 Torr. Supplying as a diluent gas a gas irrelevant to film formation, such as the evaporated gas of an organic solvent or helium makes the partial pressure of each supplied source gas low. In addition, since a crystal nucleus of $PbTiO_3$ is already formed on the wafer 104, a PZT thin film having a perovskite crystal structure is formed using the formed crystal nucleus as a seed. In the first embodiment, since in forming a PZT thin film, the vacuum degree in the reactor 101 is set to as low as 0.1 Torr, each gas supplied to the reactor 101 is supplied not in a molecular flow state but in a viscous flow state changed from an intermediate flow state.

As a result, according to the first embodiment, a uniform gas supply effect is obtained for each gas supplied to the wafer 104 due to use of the shower head 103, thus forming a PZT thin film on the wafer 104 with a uniform composition.

Figure 2A:
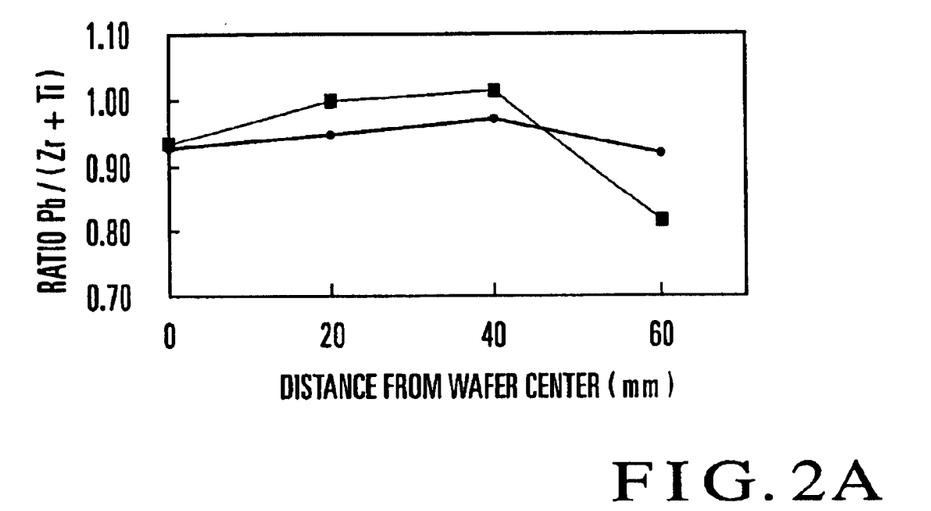
FIG. 2A is a graph for comparing the film formation state of the first embodiment of the present invention with that of the prior art.
Figure 2B:
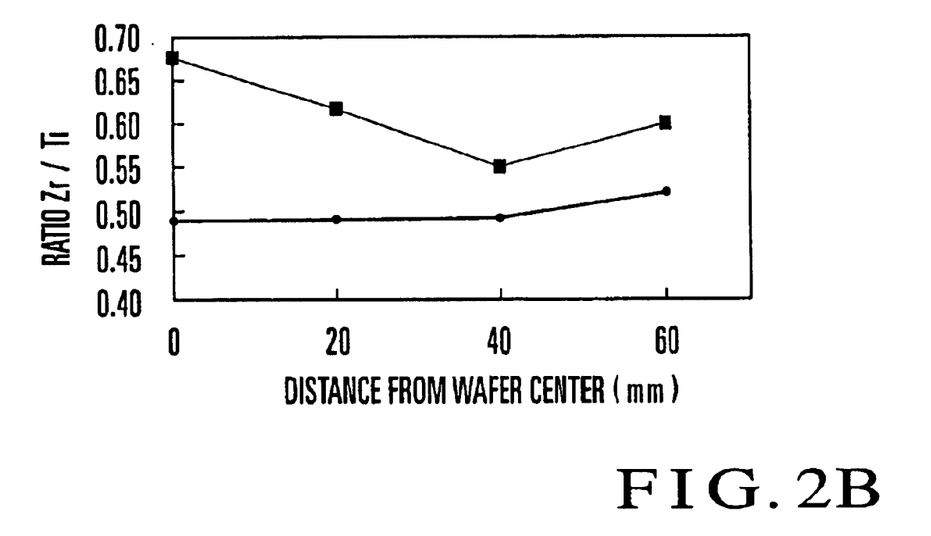
FIG. 2B is a graph for comparing the film formation state of the first embodiment of the present invention with that of the prior art.

FIGS. 2A and 2B show the results obtained by comparing the above PZT thin film with a PZT thin film formed by a conventional method. FIG. 2A shows the variations in ratio Pb/(Zr+Ti) of the formed PZT film on the wafer. That is, the ordinate of the graph shown in FIG. 2A shows the ratio Pb/(Zr+Ti). FIG. 2B shows the variations in ratio Zr/Ti of the formed PZT film on the wafer. That is, the ordinate of the graph shown in FIG. 2B shows the ratio Zr/Ti. In both graphs, black dots show the results obtained in the first embodiment, and square bullets show the results of the PZT film formed by a conventional method.

As is apparent from the results shown in FIGS. 2A and 2B, according to the first embodiment, a PZT film of perovskite crystal can be formed in the wafer with a uniform composition.

Note that although in the first embodiment, the evaporated gas of the organic solvent is used as a diluent gas, it is preferable that the evaporated gas of the organic solvent be supplied not in a large amount. An amount necessary to evaporate and supply sources is preferably used. For example, in the above case, the amount of the evaporated gas of the organic solvent is preferably limited up to 100 times the amount of the sources. Also, although helium gas is used as a diluent gas, the diluent gas is not limited to this. Other inert gases such as argon gas may be used, and nitrogen gas may also be employed.

Second Embodiment

Figure 3:
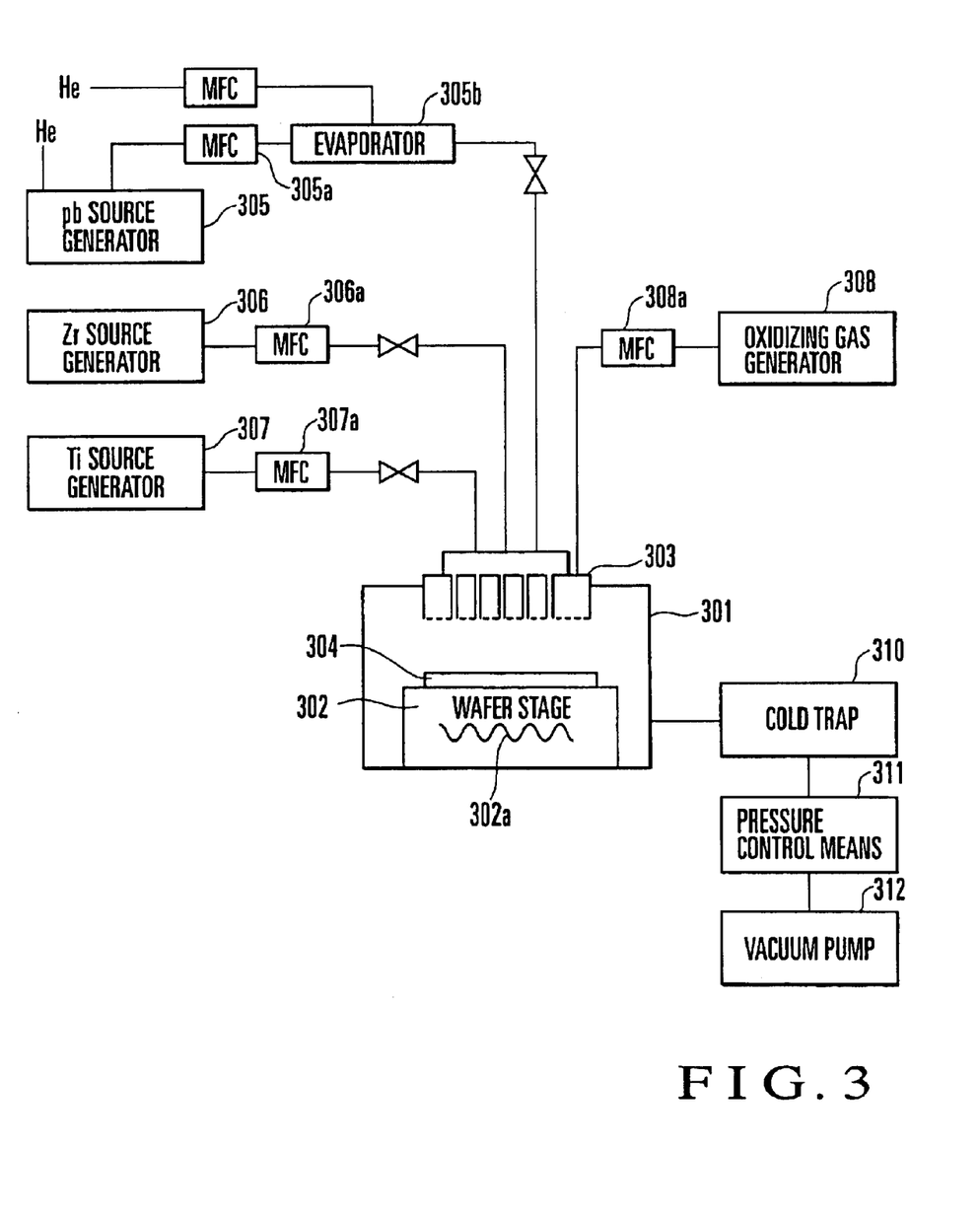
FIG. 3 is a diagram showing the arrangement of a film forming apparatus used in the second embodiment of the present invention.

Next, the second embodiment of the present invention will be described. In the second embodiment, a PZT thin film is formed by using, e.g., a film forming apparatus as shown in FIG. 3. The film forming apparatus includes a wafer stage 302 and a shower head 303 arranged opposite to the wafer stage 302 in a reactor 301. The wafer stage 302 incorporates a heater 302a, and the heater 302a heats a wafer 304 placed on the wafer stage 302. The wafer 304 is comprised of, e.g., a silicon substrate, and an integrated circuit made up of a plurality of transistors, interconnection layers, and the like is already formed on the surface of the wafer 304. These parts are almost the same as in the first embodiment.

Generated MO source gases are supplied from a Pb source generator 305, Zr source generator 306, and Ti source generator 307 to the reactor 301. An oxidizing gas such as $N_2O$ or $O_2$ is also supplied from an oxidizing gas generator 308 to the reactor 301. First, a butyl acetate solution in which $Pb(DPM)_2$ is dissolved at a concentration of 0.1 mol is prepared in the Pb source generator 305. The butyl acetate solution supplied from the Pb source generator 305, in which the Pb source is dissolved, is transported to an evaporator 305b, while the flow rate of the butyl acetate solution is controlled by a flow rate control means (MFC) 305a. Evaporation of the butyl acetate solution by the evaporator 305b allows the resultant butyl acetate gas and $Pb(DPM)_2$ gas to be supplied through the shower head 303 to the reactor 301. Note that the resultant gases together with a carrier gas such as helium is transported from the evaporator 305b to the shower head 303.

Also, in the Zr source generator 306, $Zr(O\text{-}t\text{-}Bu)_4$ is prepared. The $Zr(O\text{-}t\text{-}Bu)_4$ sublimates by heating to generate a Zr source gas. The generated source gas is supplied through the shower head 303 to the reactor 301, while the flow rate of the source gas is controlled by a flow rate control means 306a.

Similarly, in the Ti source generator 307, $Ti(O\text{-}i\text{-}Pr)_4$ is prepared. The $Ti(O\text{-}i\text{-}Pr)_4$ also sublimates by heating to generate a Ti source gas. The generated source gas is supplied through the shower head 303 to the reactor 301, while the flow rate of the source gas is controlled by a flow rate control means 307a. In the second embodiment, the Pb source generator 305 and Ti source generator 307 constitute the first source gas generation means, and the Pb source generator 305, Zr source generator 306, and Ti source generator 307 constitute the second source gas generation means.

Note that an oxidizing gas generated in the oxidizing gas generator 308 is supplied through the shower head 303 to the reactor 301, while the flow rate of the oxidizing gas is controlled by a flow rate control means 308a.

The above source gases are mixed with each other in the shower head 303 and then supplied to the reactor 301. A plurality of discharge nozzles are arranged on the reactor 301 side of the shower head 303. The source gas mixture is uniformly supplied through the plurality of discharge nozzles of the shower head 303 to the wafer 304 placed on the wafer stage 302. On the other hand, the oxidizing gas transported to the shower head 303 is discharged through another path, i.e., a plurality of dedicated discharge nozzles provided on the reactor 301 side of the shower head 303 without being mixed with the source gases in the shower head 303. The discharged oxidizing gas is mixed with the source gases on the wafer 304 placed on the wafer stage 302.

The reactor 301 communicates with a vacuum pump 312 through a cold trap 310 and pressure control means 311. The reactor 301 is so arranged as to obtain a reduced-pressure state by the vacuum pump 312 under the control of the pressure control means 311. The reduced-pressure state in the reactor 301 is controlled to fall within the range of, e.g., about 0.001 to 10 Torr. Note that the cold trap 310 removes a substance discharged from the reactor 301, which liquefies at a low temperature.

In the second embodiment, by using the apparatus described above, a PZT thin film is formed on the wafer 304 in the following manner.

First of all, a crystal nucleus of $PbTiO_3$ is formed on the wafer 304.

First, the wafer 304 is placed on the wafer stage 302, and the heater 302a heats the wafer 304 to a temperature within the range of 400 to 450° C. The vacuum degree in the reactor 301 is set at 0.1 Torr by, e.g., evacuation using the vacuum pump 312.

Next, after $N_2O$ as the oxidizing gas is supplied to the wafer 304, Pb source gas is supplied in the following manner. A butyl acetate solution in which $Pb(DPM)_2$ is dissolved at a concentration of 0.1 mol is transported from the Pb source generator 305 to the evaporator 305b, while the flow rate of the butyl acetate solution is controlled to a 0.15 g/min by the flow rate control means 305a, to evaporate the $Pb(DPM)_2$ dissolved together with the butyl acetate by the evaporator 305b. Helium gas is added to these at a flow rate of 250 sccm, and the mixed gas is transported to the shower head 303. The Pb source gas is then supplied from the shower head 303 to the wafer 304. At this time, the transport flow rate of the Pb source gas, i.e., the evaporated $Pb(DPM)_2$ transported from the evaporator 305b is set at about 0.35 sccm in a normal state. Also, the transport flow rate of the evaporated butyl acetate is about 27 sccm. $N_2O$ is transported to the shower head 303 at a flow rate of 6 sccm.

After supplying the oxidizing gas and Pb source gas is performed for a predetermined time, while supplying these gases, gas (Ti source gas) obtained by sublimating $Ti(O\text{-}i\text{-}Pr)_4$ is transported at a flow rate of 0.31 sccm from the Ti source generator 307 to the shower head 303. As a result, the Pb source gas, Ti source gas, butyl acetate, and helium transported to the shower head 303 are mixed with each other in the shower head 303 and supplied to the wafer 304 in the reactor 301. On the other hand, $N_2O$ is supplied to the wafer 304 in the reactor 301 without being mixed with the source gases.

At this time, on the wafer 304 in the reactor 301, the partial pressure of $Pb(DPM)_2$ as the Pb source gas is 0.1 Torr×{0.35/(0.35+27+250+6+0.31)}≈0.000123 Torr. Also, the partial pressure of $Ti(O-i-Pr)_4$ as the Ti source gas is 0.1 Torr×{0.31/(0.35+27+250+6+0.31)}≈0.000109 Torr.

As described above, in the second embodiment, the pressure in the reactor 301 is about 0.1 Torr, i.e., in a low vacuum state. Since the partial pressure of each source gas supplied to the wafer 304 is set low, a crystal nucleus of $PbTiO_3$ is formed on the heated wafer 304. The formation of crystal nuclei is performed for about 50 sec.

Next, subsequent to the nucleus formation, a PZT thin film is formed in the following manner.

First, while the heating temperature of the wafer 304 and the vacuum degree in the reactor 301 are held at the same level as in the previous step, Zr source gas is supplied to the wafer 304. The Zr source gas, i.e., a gas obtained by sublimating $Zr(O-t-Bu)_4$ is transported at a flow rate of 0.33 sccm from the Zr source generator 306 to the shower head 303. As a result, in the shower head 303, the Zr source gas is added to the Pb source gas, Ti source gas, butyl acetate, and helium and mixed with each other. The Pb source gas, Ti source gas, Zr source gas, butyl acetate and helium mixed in advance are supplied to the wafer 304. $N_2O$ is also supplied to the wafer 304 separately from the source gases.

At this time, on the wafer 304 in the reactor 301, the partial pressure of $Pb(DPM)_2$ as the Pb source gas is 0.1 Torr×{0.35/(0.35+27+250+0.31+0.33+6)}≈0.000123 Torr. Also, the partial pressure of $Ti(O-i-Pr)_4$ as the Ti source gas is 0.000109 Torr, and that of $Zr(O-t-Bu)_4$ as the Zr source gas is 0.000116 Torr.

As described above, in the second embodiment, the pressure in the reactor 301 is about 0.1 Torr, i.e., in a low vacuum state. Adding as a diluent gas a gas irrelevant to film formation, such as the evaporated gas of an organic solvent or helium makes the partial pressure of each source gas supplied to the wafer low. In addition, since a crystal nucleus of $PbTiO_3$ is already formed on the wafer 304, a PZT thin film having a perovskite crystal structure is formed on the wafer 304 using the formed crystal nucleus as a seed. In the second embodiment, since in forming a PZT thin film, the vacuum degree in the reactor 301 is set to as low as 0.1 Torr, each gas supplied to the reactor 301 is supplied not in a molecular flow state but in a viscous flow state changed from an intermediate flow state.

As a result, according to the second embodiment, a uniform gas supply effect is obtained for each gas supplied to the wafer 304 due to use of the shower head 303, thus forming a PZT thin film on the wafer 304 with a uniform composition.

Figure 4A:
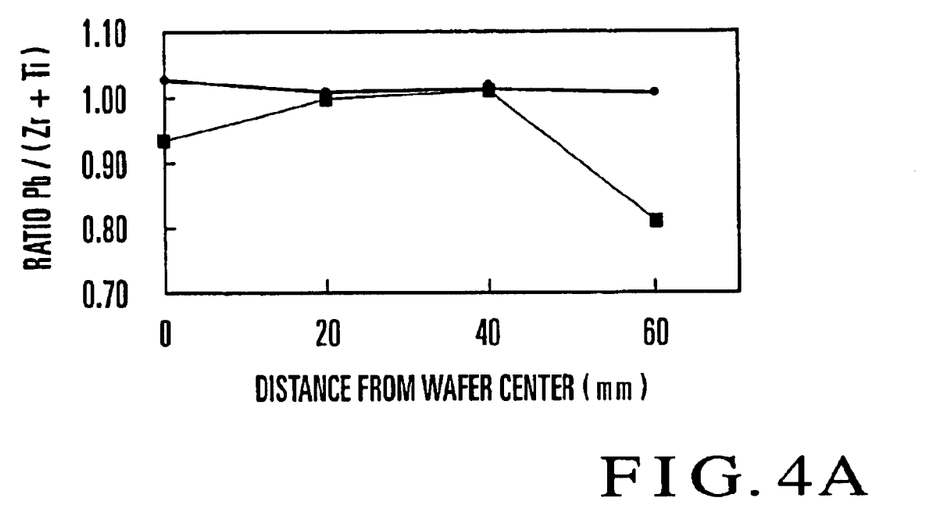
FIG. 4A is a graph for comparing the film formation state of the second embodiment of the present invention with that of the prior art.
Figure 4B:
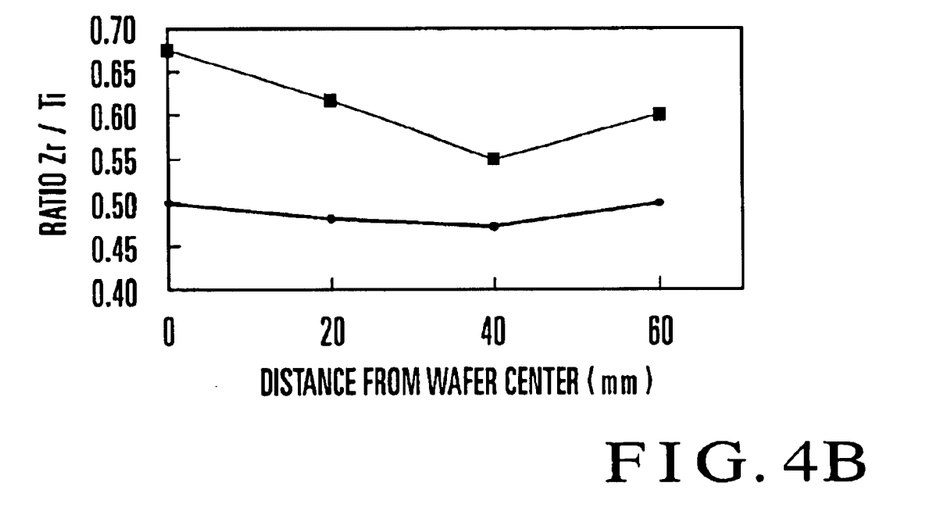
FIG. 4B is a graph for comparing the film formation state of the second embodiment of the present invention with that of the prior art.

FIGS. 4A and 4B show the results obtained by comparing the above PZT thin film with a PZT thin film formed by a conventional method. FIG. 4A shows the variations in ratio Pb/(Zr+Ti) of the formed PZT film on the wafer. That is, the ordinate of the graph shown in FIG. 4A shows the ratio Pb/(Zr+Ti). FIG. 4B shows the variations in ratio Zr/Ti of the formed PZT film on the wafer. That is, the ordinate of the graph shown in FIG. 4B shows the ratio Zr/Ti. In both graphs, black dots show the results obtained in the second embodiment, and square bullets show the results of the PZT film formed by a conventional method.

As is apparent from the results shown in FIGS. 4A and 4B, according to the second embodiment, a PZT film of perovskite crystal can also be formed in the wafer with a uniform composition.

Note that although in the second embodiment, the evaporated gas of the organic solvent is used as a diluent gas, it is preferable that the evaporated gas of the organic solvent be supplied not in a large amount. An amount necessary to evaporate and supply sources is preferably used. For example, in the above case, the amount of the evaporated gas of the organic solvent is preferably limited up to 100 times the amount of the sources. Also, although helium gas is used as a diluent gas, the diluent gas is not limited to this. Other inert gases such as argon gas may be used, and nitrogen gas may also be employed.

Third Embodiment

Figure 5:
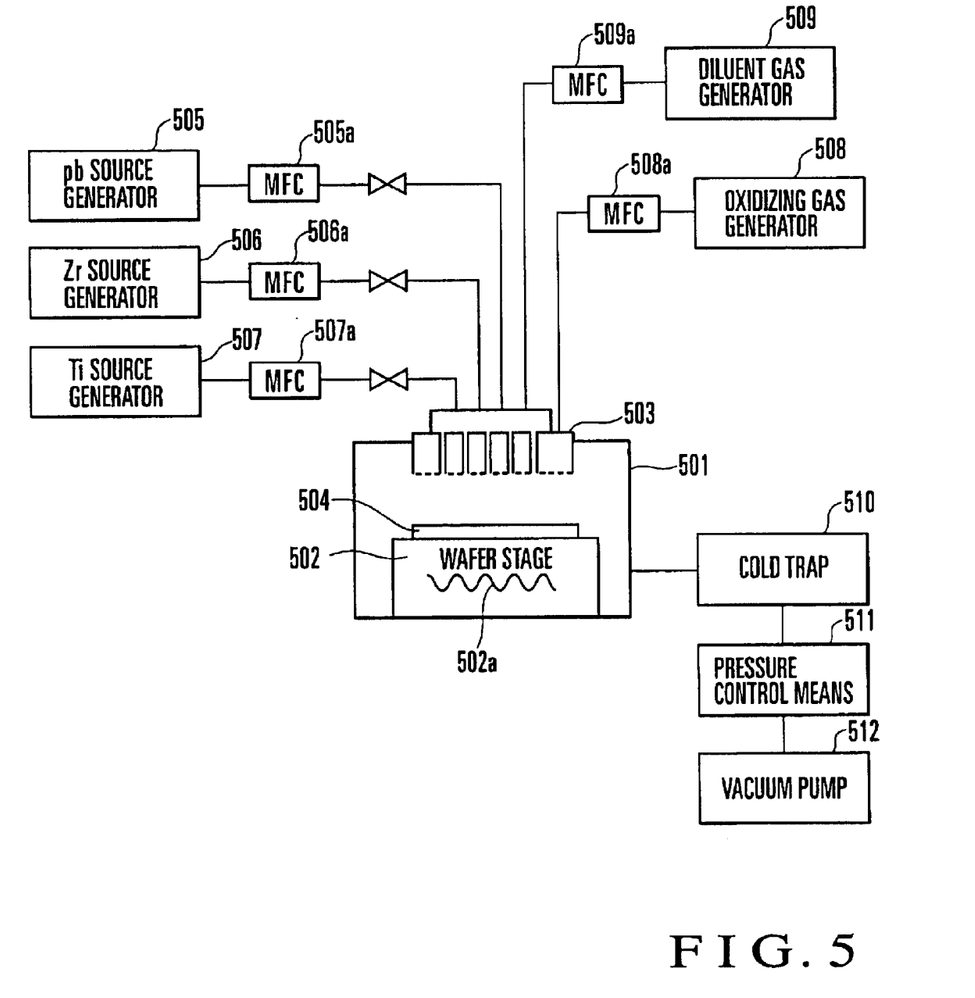
FIG. 5 is a diagram showing the arrangement of a film forming apparatus used in the third embodiment of the present invention.

Next, the third embodiment of the present invention will be described. In the third embodiment, a PZT thin film is formed by using, e.g., a film forming apparatus as shown in FIG. 5. The film forming apparatus includes a wafer stage 502 and a shower head 503 arranged opposite to the wafer stage 502 in a reactor 501. The wafer stage 502 incorporates a heater 502a, and the heater 502a heats a wafer 504 placed on the wafer stage 502. The wafer 504 is comprised of, e.g., a silicon substrate, and an integrated circuit made up of a plurality of transistors, interconnection layers, and the like is already formed on the surface of the wafer 504. These parts are almost the same as in the first and second embodiments.

Generated MO source gases are supplied from a Pb source generator 505, Zr source generator 506, and Ti source generator 507 to the reactor 501. An oxidizing gas such as $N_2O$ or $O_2$ is also supplied from an oxidizing gas generator 508 to the reactor 501.

First, in the Pb source generator 505, $Pb(DPM)_2$ is prepared. The $Pb(DPM)_2$ sublimates by heating to generate a Pb source gas. The generated source gas is supplied through the shower head 503 to the reactor 501, while the flow rate of the source gas is controlled by a flow rate control means 505a.

Also, in the Zr source generator 506, $Zr(O-t-Bu)_4$ is prepared. The $Zr(O-t-Bu)_4$ sublimates by heating to generate a Zr source gas. The generated source gas is supplied through the shower head 503 to the reactor 501, while the flow rate of the source gas is controlled by a flow rate control means 506a.

Similarly, in the Ti source generator 507, $Ti(O-i-Pr)_4$ is prepared. The $Ti(O-i-Pr)_4$ also sublimates by heating to generate a Ti source gas. The generated source gas is supplied through the shower head 503 to the reactor 501, while the flow rate of the Ti source gas is controlled by a flow rate control means 507a.

Note that an oxidizing gas generated in the oxidizing gas generator 508 is supplied through the shower head 503 to the reactor 501, while the flow rate of the oxidizing gas is controlled by a flow rate control means 508a.

The above source gases are mixed with each other in the shower head 503 and then supplied to the reactor 501. A plurality of discharge nozzles are arranged on the reactor 501 side of the shower head 503. The source gas mixture is uniformly supplied through the plurality of discharge nozzles of the shower head 503 to the wafer 504 placed on the wafer stage 502. On the other hand, the oxidizing gas transported to the shower head 503 is discharged through another path, i.e., a plurality of dedicated discharge nozzles provided on the reactor 501 side of the shower head 503 without being mixed with the source gases in the shower head 503. The discharged oxidizing gas is mixed with the source gases on the wafer 504 placed on the wafer stage 502.

A film forming apparatus used in the third embodiment further includes a diluent gas generator 509, and in the film forming apparatus, a diluent gas made of an inert gas such as helium is transported to the shower head 503, while the flow rate of the diluent gas is controlled by a flow rate control means 509a. The diluent gas is mixed with the source gases in the shower head 503 and supplied to the reactor 501.

The reactor 501 communicates with a vacuum pump 512 through a cold trap 510 and pressure control means 511. The reactor 501 is so arranged as to obtain a reduced-pressure state by the vacuum pump 512 under the control of the pressure control means 511. The reduced-pressure state in the reactor 501 is controlled to fall within the range of, e.g., about 0.001 to 10 Torr. Note that the cold trap 510 removes a substance discharged from the reactor 501, which liquefies at a low temperature.

In the third embodiment, by using the apparatus described above, a PZT thin film is formed on the wafer 504 in the following manner.

First of all, a crystal nucleus of $PbTiO_3$ is formed on the wafer 504.

First, the wafer 504 is placed on the wafer stage 502, and the heater 502a heats the wafer 504 to a temperature within the range of 400 to 450° C. The vacuum degree in the reactor 501 is set at 0.1 Torr by, e.g., evacuation using the vacuum pump 512.

Under the above setting conditions, $N_2O$ as the oxidizing gas is supplied to the wafer 504, and then a Pb source gas obtained by heating to a temperature of 170° C. and sublimating $Pb(DPM)_2$ is transported at a flow rate of 0.4 sccm from the Pb source generator 505 to the shower head 503. The Pb source gas is then supplied to the wafer 504. Note that $N_2O$ is transported to the shower head 503 at a flow rate of 5 sccm.

After supplying the oxidizing gas and Pb source gas is performed for a predetermined time, while supplying these gases, a Ti source gas obtained by heating to a temperature of 80° C. and sublimating $Ti(O-i-Pr)_4$ is transported at a flow rate of 0.3 sccm from the Ti source generator 507 to the shower head 503. In addition, in the third embodiment, nitrogen gas as a diluent gas is transported at a flow rate of 250 sccm from the diluent gas generator 509 to the shower head 503.

With the above process, the Pb source gas, Ti source gas, and the diluent gas transported to the shower head 503 are mixed in the shower head 503 and supplied to the wafer 504 in the reactor 501. On the other hand, $N_2O$ is supplied to the wafer 504 in the reactor 501 without being mixed with the source gases in the shower head 503.

At this time, on the wafer 504 in the reactor 501, the partial pressure of $Pb(DPM)_2$ as the Pb source gas is 0.1 Torr×$\{0.4/(0.4+0.3+250+5)\}$≈0.000156 Torr. Also, the partial pressure of $Ti(O-i-Pr)_4$ as the Ti source gas is 0.1 Torr×$\{0.3/(0.4+0.3+250+5)\}$≈0.000117 Torr.

As described above, in the third embodiment, the pressure in the reactor 501 is about 0.1 Torr, i.e., in a low vacuum state. Since the partial pressure of each source gas supplied to the wafer 504 is set low by adding a diluent gas, a crystal nucleus of $PbTiO_3$ is formed on the heated wafer 504. The formation of crystal nuclei is performed for about 50 sec.

Next, subsequent to the nucleus formation, a PZT thin film is formed in the following manner.

First, while the heating temperature of the wafer 504 and the vacuum degree in the reactor 501 are held at the same level as in the previous step, Zr source gas is supplied to the wafer 504. Gas (Zr source gas) obtained by sublimating $Zr(O-t-Bu)_4$ is transported at a flow rate of 0.3 sccm from the Zr source generator 506 to the shower head 503. The transport flow rate of the Ti source gas is set at 0.35 sccm.

As a result, in the shower head 503, the Zr source gas is added to the Pb source gas, Ti source gas, and the diluent gas and mixed with each other. The Pb source gas, Ti source gas, Zr source gas, and the diluent gas mixed in advance is supplied to the wafer 504. $N_2O$ is also supplied to the wafer 504 separately from the source gases.

At this time, on the wafer 504 in the reactor 501, the partial pressure of $Pb(DPM)_2$ as the Pb source gas is 0.1 Torr×$\{0.4/(0.4+0.35+0.3+250+5)\}$≈0.000156 Torr. Also, the partial pressure of $Ti(O-i-Pr)_4$ as the Ti source gas is 0.000137 Torr, and that of $Zr(O-t-Bu)_4$ as the Zr source gas is 0.000117 Torr.

As described above, in the third embodiment, the pressure in the reactor 501 is about 0.1 Torr, i.e., in a low vacuum state. Adding as a diluent gas nitrogen gas irrelevant to film formation makes the partial pressure of each source gas supplied to the wafer 504 low. In addition, since a crystal nucleus of $PbTiO_3$ is already formed on the wafer 504, a PZT thin film having a perovskite crystal structure is formed on the wafer 504 using the formed crystal nucleus as a seed.

In the third embodiment, since in forming a PZT thin film, the vacuum degree in the reactor 501 is set to as low as 0.1 Torr, each gas supplied to the reactor 501 is supplied not in a molecular flow state but in a viscous flow state changed from an intermediate flow state.

As a result, according to the third embodiment, a uniform gas supply effect is obtained for each gas supplied to the wafer 504 due to use of the shower head 503, thus forming a PZT thin film on the wafer 504 with a uniform composition.

Figure 6A:
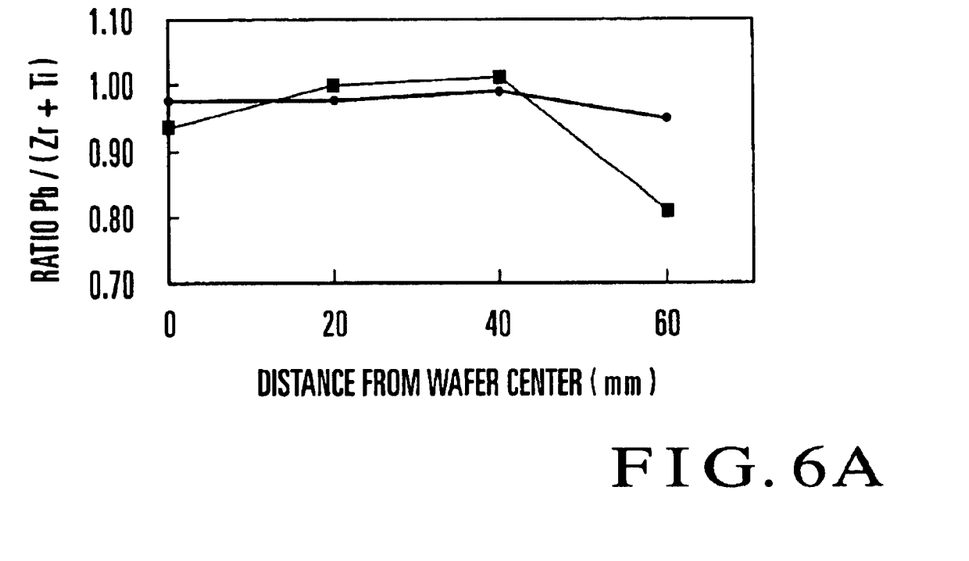
FIG. 6A is a graph for comparing the film formation state of the third embodiment of the present invention with that of the prior art.
Figure 6B:
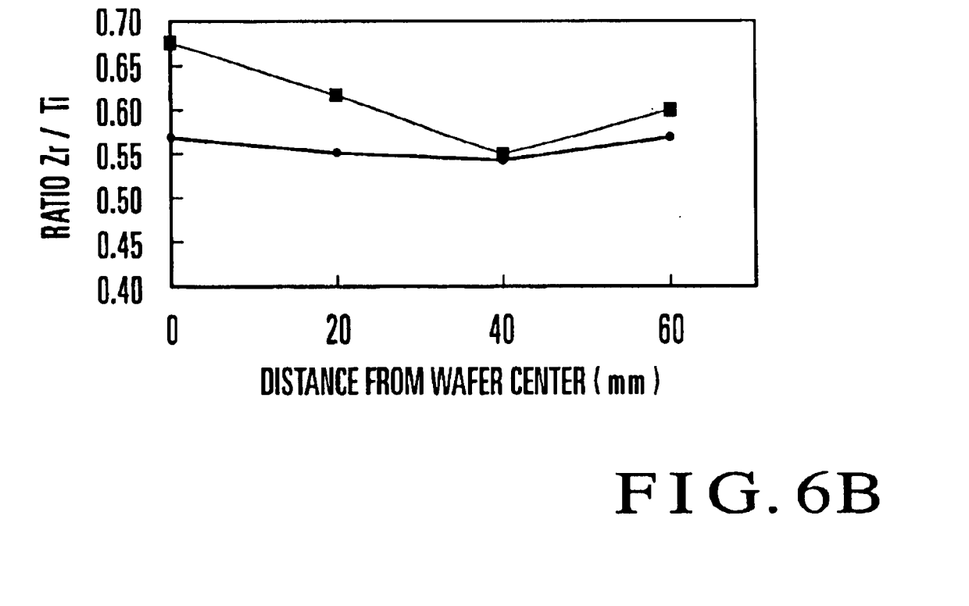
FIG. 6B is a graph for comparing the film formation state of the third embodiment of the present invention with that of the prior art.

FIGS. 6A and 6B show the results obtained by comparing the above PZT thin film with a PZT thin film formed by a conventional method. FIG. 6A shows the variations in ratio Pb/(Zr+Ti) of the formed PZT film on the wafer. That is, the ordinate of the graph shown in FIG. 6A shows the ratio Pb/(Zr+Ti). FIG. 6B shows the variations in ratio Zr/Ti of the formed PZT film on the wafer. That is, the ordinate of the graph shown in FIG. 6B shows the ratio Zr/Ti. In both graphs, black dots show the results obtained in the third embodiment, and square bullets show the results of the PZT film formed by a conventional method.

As is apparent from the results shown in FIGS. 6A and 6B, according to the third embodiment, a PZT film of perovskite crystal can also be formed in the wafer with a uniform composition.

Note that although in the third embodiment, helium gas is used as a diluent gas, the diluent gas is not limited to this. Other inert gases such as argon gas may be used, and nitrogen gas may also be employed.

In a thin film forming method according to the present invention, as described in the above first to third embodiments, since the vacuum degree is set to as low as 0.1 Torr at the stage of forming a PZT thin film, source gases and the like can be supplied in a larger amount to a reactor. In this manner, since a larger amount of source gases can be fed to the reactor, the PZT film formation rate can be increased.

Figure 7:
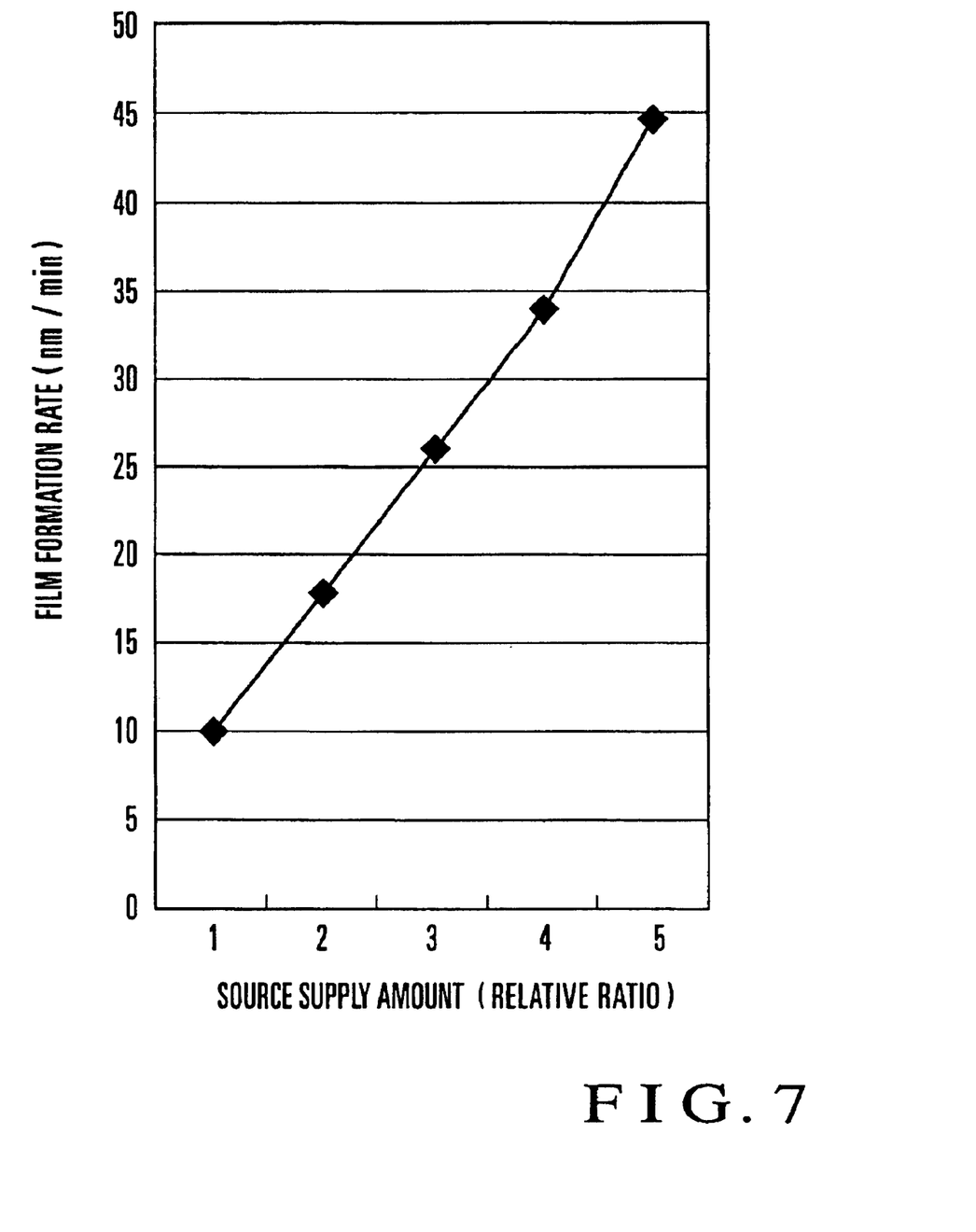
FIG. 7 is graph showing the correlation between the supply amount of source gases and the film formation rate.

FIG. 7 is a graph showing the correlation between the supply amount of source gases and the film formation rate.

As is apparent from FIG. 7, the film formation rate can be increased by increasing the supply amount of source gases.

Fourth Embodiment

Figure 8:
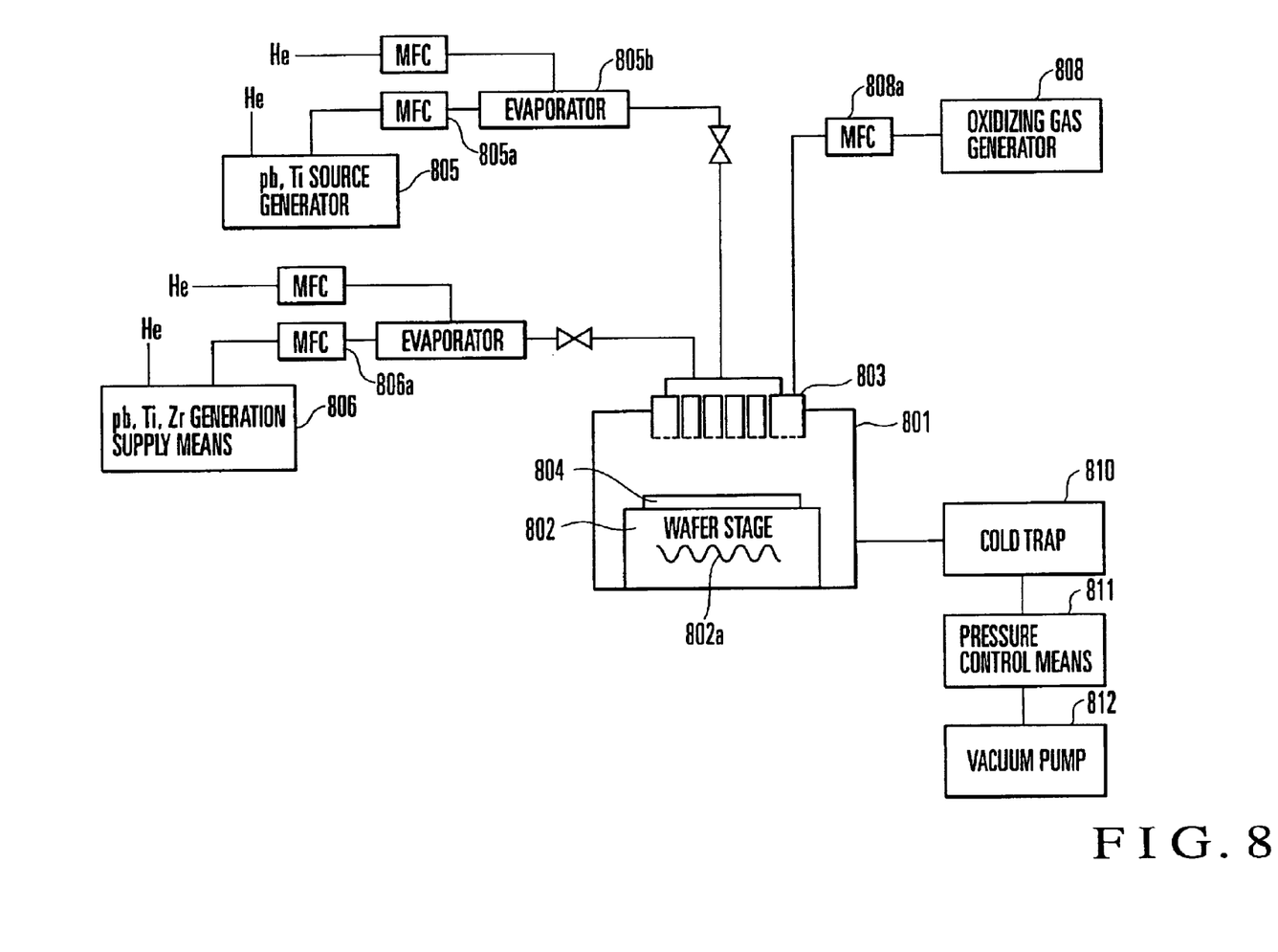
FIG. 8 is a diagram showing the arrangement of a film forming apparatus used in the fourth embodiment of the present invention.

Next, the fourth embodiment of the present invention will be described. In the fourth embodiment, a PZT thin film is formed by using, e.g., a film forming apparatus as shown in FIG. 8. The film forming apparatus includes a wafer stage 802 and a shower head 803 arranged opposite to the wafer stage 802 in a reactor 801. The wafer stage 802 incorporates a heater 802a, and the heater 802a heats a wafer 804 placed on the wafer stage 802. The wafer 804 is comprised of, e.g., a silicon substrate, and an integrated circuit made up of a plurality of transistors, interconnection layers, and the like is already formed on the surface of the wafer 804. These parts are almost the same as in the first embodiment.

Generated MO source gases are supplied from a crystal nucleus source generator 805 and crystal film source generator 806 to the reactor 801. A generated oxidizing gas such as $N_2O$ or $O_2$ is also supplied from an oxidizing gas generator 808 to the reactor 801.

First, a butyl acetate solution in which $Pb(DPM)_2$ and $Ti(i-OC_3H_7)_4$ are dissolved is prepared in the crystal nucleus source generator 805. The butyl acetate solution fed from the crystal nucleus source generator 805, in which the Pb source, Ti source, and Zr source are dissolved, is transported to an evaporator 805b, while the flow rate of the butyl acetate solution is controlled by a flow rate control means (MFC) 805a. Evaporation of the butyl acetate solution by the evaporator 805b allows the resultant butyl acetate gas, $Pb(DPM)_2$ gas, and $Ti(i-OC_3H_7)_4$ gas mixed in advance to be supplied through the shower head 803 to the reactor 801. Note that the resultant gases together with a carrier gas such as helium is transported from the evaporator 805b to the shower head 803.

Also, a butyl acetate solution in which $Pb(DPM)_2$, $Ti(i-OC_3H_7)_4$, and $Zr(t-OC_4H_9)_4$ are dissolved is prepared in the crystal film source generator 806. The butyl acetate solution, in which the Pb source, Ti source, and Zr source fed from the crystal film source generator 806 are dissolved, is transported to an evaporator 806b, while the flow rate of the butyl acetate solution is controlled by a flow rate control means (MFC) 806a. Evaporation of the butyl acetate solution by the evaporator 806b allows the resultant butyl acetate gas, $Pb(DPM)_2$ gas, $Ti(i-OC_3H_7)_4$ gas, and $Zr(t-OC_4H_9)_4$ mixed in advance to be supplied through the shower head 803 to the reactor 801.

Note that an oxidizing gas generated in the oxidizing gas generator 808 is supplied through the shower head 803 to the reactor 801, while the flow rate of the oxidizing gas is controlled by a flow rate control means 808a.

The above source gases are supplied from the shower head 803 to the reactor 801. A plurality of discharge nozzles are arranged on the reactor 801 side of the shower head 803. The source gas mixture is uniformly supplied through the plurality of discharge nozzles of the shower head 803 to the wafer 804 placed on the wafer stage 802. On the other hand, the oxidizing gas transported to the shower head 803 is discharged through another path, i.e., a plurality of dedicated discharge nozzles provided on the reactor 801 side of the shower head 803 without being mixed with the source gases in the shower head 803. The discharged oxidizing gas is mixed with the source gases on the wafer 804 placed on the wafer stage 802.

The reactor 801 communicates with a vacuum pump 812 through a cold trap 810 and pressure control means 811. The reactor 801 is so arranged as to obtain a reduced-pressure state by the vacuum pump 812 under the control of the pressure control means 811. The reduced-pressure state in the reactor 801 is controlled to fall within the range of, e.g., about 0.001 to 10 Torr. Note that the cold trap 810 removes a substance discharged from the reactor 801, which liquefies at a low temperature.

Next, formation of a PZT thin film by using the apparatus described above will be explained.

First of all, a crystal nucleus of $PbTiO_3$ is formed on the wafer 804.

First, the wafer 804 is placed on the wafer stage 802, and the heater 802a heats the wafer 804 to a temperature within the range of 400 to 450° C. The vacuum degree in the reactor 801 is set at 0.1 Torr by, e.g., evacuation using the vacuum pump 812.

A butyl acetate solution in which the Pb source and Ti source are dissolved is transported from the crystal nucleus source generator 805 to the evaporator 805b, while the flow rate of the butyl acetate solution is controlled to a predetermined flow rate by the flow rate control means 805a, to evaporate the sources dissolved together with the butyl acetate by the evaporator 805b. Helium gas is added to these at a predetermined flow rate, and the mixed gas is transported to the shower head 803.

With the above process, the Pb source gas, Ti source gas, butyl acetate, and helium mixed in advance are transported to the shower head 803 and supplied uniformly through the shower head 803 to the wafer 804 in the reactor 801. On the other hand, $N_2O$ is supplied to the wafer 804 in the reactor 801 without being mixed with the source gases in the shower head 803. In the fourth embodiment, the pressure in the reactor 801 is about 0.1 Torr, i.e., also in a low vacuum state. When the partial pressure of each supplied source gas is set low in the same manner as in the above second embodiment, a crystal nucleus of $PbTiO_3$ is formed on the heated wafer 804.

Next, subsequent to the nucleus formation, a PZT thin film is formed in the following manner.

First, while the heating temperature of the wafer 804 and the vacuum degree in the reactor 801 are held at the same level as in the previous step, a butyl acetate solution in which the Pb source, Ti source, and Zr source are dissolved is transported from the crystal film source generator 806 to the evaporator 806b, while the flow rate of the butyl acetate solution is controlled to a predetermined flow rate. The sources dissolved together with the butyl acetate are evaporated by the evaporator 806b. Helium gas is added to these at a predetermined flow rate, and the mixture gas is transported to the shower head 803.

With the above process, the Pb source gas, Ti source gas, Zr source gas, butyl acetate, and helium mixed in advance are transported to the shower head 803 and supplied uniformly from the shower head 803 to the wafer 804 in the reactor 801. On the other hand, $N_2O$ is supplied to the wafer 804 in the reactor 801 without being mixed with the source gases in the shower head 803. As a result, the source gases, in which the Pb source gas, Ti source gas, butyl acetate, helium, and Zr source gas are mixed, are supplied from the shower head 803 to the wafer 804. Note that $N_2O$ is also supplied to the wafer 804 separately from the source gases.

In the fourth embodiment, the pressure in the reactor 801 is also set to about 0.1 Torr, i.e., in a low vacuum state. When the partial pressure of each supplied source gas is set low in the same manner as in the above second embodiment, a PZT thin film having a perovskite crystal structure is formed on the wafer 804 using the formed crystal nucleus as a seed. In the fourth embodiment, since in forming a PZT thin film, the vacuum degree in the reactor 801 is also set to as low as 0.1 Torr, each gas supplied to the reactor 801 is supplied not in a molecular flow state but in a viscous flow state changed from an intermediate flow state.

According to the fourth embodiment, since the source gases mixed in advance are transported to the shower head 803, a PZT thin film can be formed on the wafer 804 with a uniform composition.

Note that although in the fourth embodiment, the evaporated gas of the organic solvent is used as a diluent gas, it is preferable that the evaporated gas of the organic solvent be supplied not in a large amount. An amount necessary to evaporate and supply sources is preferably used. For example, in the above case, the amount of the evaporated gas of the organic solvent is preferably limited up to 100 times the amount of the sources. Also, although helium gas is used as a diluent gas, the diluent gas is not limited to this. Other inert gases such as argon gas may be used, and nitrogen gas may also be employed.

As described above, according to the present invention, in the second step, the organic metal source gases and the like are supplied in a viscous flow state changed from an intermediate flow state. Since the organic metal source gases are supplied after undergoing dilution with a diluent gas, the partial pressure of each source gas on a substrate is as low as less than 0.01 Torr, even at a high pressure. That is, in the second step, film formation is performed in a high vacuum state. As a result, according to the present invention, since the organic metal sources and the like can uniformly be supplied, a PZT film of perovskite crystal used for a capacitor dielectric film or the like of a DRAM can uniformly be formed at a low temperature of 450° C. or less.

What is claimed is:

1. A method of forming a thin film on a substrate in a reactor comprising a side having a shower head with a plurality of nozzles and a separate discharge nozzle, the method comprising:

positioning the substrate in the reactor;

heating the substrate to a predetermined temperature;

supplying the reactor with organic metal source gases comprising lead, zirconium, and titanium via the plurality of nozzles, wherein the organic metal source gases are diluted with a diluent gas;

supplying the reactor with an oxidizing gas via the separate discharge nozzle; and forming a ferroelectric film on the substrate, the ferroelectric film comprising a perovskite crystal structure formed by an oxide comprising lead, zirconium, and titanium, wherein a total pressure in the reactor is at least about 0.1 Torr.

2. The method of claim 1, wherein the oxidizing gas and the organic metal source gases of lead and titanium are supplied to the substrate at a pressure ranging from about 0.001 Torr to about 0.01 Torr.

3. The method of claim 1, wherein the oxidizing gas and the organic metal source gases of lead and titanium diluted with the diluent gas are supplied to the substrate at a pressure ranging from about 0.001 Torr to about 0.01 Torr.

4. The method of claim 1, wherein the oxidizing gas and the organic metal source gases of lead and titanium diluted with the diluent gas are supplied to the substrate at a pressure of at least about 0.1 Torr.

5. The method of claim 1, wherein the oxidizing gas and the organic metal source gases of lead and titanium diluted with the diluent gas are supplied to the substrate by dissolving at least one of an organic metal source of lead and titanium in an organic solvent and by evaporating the organic solvent.

6. The method of claim 1, further comprising:

dissolving at least one of an organic metal source of lead and titanium in an organic solvent; and evaporating and supplying the organic solvent with the organic metal source gases and the diluent gas to the reactor.

7. The method of claim 1, wherein the total pressure is at least partially achieved via the diluent gas.

8. The method of claim 7, wherein the diluent gas comprises an inert gas.

9. The method of claim 1, further comprising forming a crystal nucleus of perovskite structure formed by an oxide comprising lead and titanium on the substrate prior to forming the ferroelectric film.

10. The method of claim 1, wherein a solution, in which an organic metal source of lead, an organic metal source of zirconium, and an organic metal source of titanium are dissolved, is transported to a vaporizer, and, by respectively vaporizing said organic metal sources by vaporizing said solution, each of said metal source gases is generated.

* * * * *